United States Patent
Flanigan et al.

(10) Patent No.: US 6,582,857 B1
(45) Date of Patent: Jun. 24, 2003

(54) REPAIR OF MASKS TO PROMOTE ADHESION OF PATCHES

(75) Inventors: Philip S. Flanigan, South Burlington, VT (US); Dennis M. Hayden, Essex Junction, VT (US); Michael S. Hibbs, Westford, VT (US); Timothy E. Neary, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/526,858

(22) Filed: Mar. 16, 2000

(51) Int. Cl.[7] .............. G03F 9/00; G03C 5/00; B05B 3/00; C23C 14/02
(52) U.S. Cl. .......... 430/5; 430/323; 430/324; 427/534; 427/554; 427/555; 427/556
(58) Field of Search ............ 430/5, 322, 323, 430/324; 382/144; 219/121; 427/466, 534, 553, 554, 555, 556, 596

(56) References Cited

U.S. PATENT DOCUMENTS

| | | |
|---|---|---|
| 4,980,536 A | 12/1990 | Asch et al. |
| 5,024,968 A | 6/1991 | Engelsberg |
| 5,099,557 A | 3/1992 | Engelsberg |
| 5,151,135 A | 9/1992 | Magee et al. |
| 5,332,879 A | 7/1994 | Radhakrishnan et al. |
| 5,531,857 A | 7/1996 | Engelsberg et al. |
| 5,643,472 A | 7/1997 | Engelsberg et al. |
| 5,656,186 A * | 8/1997 | Mourou et al. ........ 219/121.69 |
| 5,669,979 A | 9/1997 | Elliott et al. |
| 5,686,206 A | 11/1997 | Baum et al. |
| 5,800,625 A | 9/1998 | Engelsberg et al. |
| 5,821,175 A | 10/1998 | Engelsberg |
| 5,878,943 A | 3/1999 | Nishikawa et al. |
| 5,958,268 A | 9/1999 | Engelsberg et al. |
| 5,965,042 A | 10/1999 | Saitoh |
| 6,165,649 A * | 12/2000 | Grenon et al. ................ 430/5 |
| 6,277,526 B1 * | 8/2001 | Yang ........................... 430/5 |

OTHER PUBLICATIONS

IBM Technical Disclosure Bulletin, Vo. 37., No. 10, Oct. 1994.

* cited by examiner

Primary Examiner—Mark F. Huff
Assistant Examiner—Saleha R. Mohamedulla
(74) Attorney, Agent, or Firm—Schmeiser, Olsen & Watts; Richard Kotulak

(57) ABSTRACT

The current invention performs short pulse laser ablation of clear defect regions on a mask prior to patching the clear defect regions. The short-pulse laser ablation removes any residue that absorbs light. Thus, the ablation completely cleans the surface of the clear defect regions, meaning that any patches of the surface will better adhere to the surface of the mask. This is particularly important during those situations where a later etch of a conductive surface added to the mask creates a solvent because the etchant interacts with residue on the mask, and wherein the solvent attacks the patch material at the patch material's interface.

23 Claims, 3 Drawing Sheets

REPAIR OF MASKS TO PROMOTE ADHESION OF PATCHES

BACKGROUND OF THE INVENTION

1. Technical Field

This invention relates to the field of semiconductor processing. More specifically, the invention relates to the repair of masks to promote adhesion of patches.

2. Background Art

Phase shift masks are masks, generally made of quartz, that are partially covered with phase shift material and partially clear. If the phase shift material is "attenuated" phase shift material, the attenuated phase shift material causes a reduction in light energy to a level beneath that required to cause positive photoresist, for example, to become removable. On the other hand, light passing through the clear areas is at a high enough energy that the photoresist becomes removable. The attenuated phase shift material changes light passing through it to be out of phase with light passing through the clear areas. At the junction between a phase shift material and a clear area, a reduction in light energy occurs due to cancellation caused by the differences in phase between light passing through the phase shift material and through the clear area. This cancellation of light energy causes an improvement in edge resolution. In other words, the edges are much more sharply defined and steeper than what would otherwise result.

A "clear defect" on a phase-shift mask is an area where there is no phase shift material, but where there should be phase shift material. Generally, clear defects are caused by imperfections in the photoresist that is used to define the areas on the mask of attenuated phase-shift material. Clear defects are usually patched, as if the clear defects are not patched, the defects will essentially be replicated (will "print") in the photoresist. To patch clear defects, Focused Ion Beam(FIB) milling of the defect areas is generally used, and is usually followed by FIB deposition of patch material. However, under certain conditions, all or some of the patch can come off the reticle's surface. If any part of the patch comes off, the part no longer patched will be printed on the photoresist as a defect.

What is needed is a way of repairing phase shift masks to promote adhesion of clear defect patches and to thereby reduce the propensity for patches on phase shift masks to lift off the reticle surface.

DISCLOSURE OF INVENTION

Before proceeding to important aspects of the current invention, it is important to understand at this point simple descriptions of the problems associated with clear defect patches. Consequently, a more detailed analysis of the problem will be discussed. Attenuated phase shift material is usually etched through a dry etch, and this etching can leave residue (illustratively, fluorine). Prior to milling of clear defects with a Focused Ion Beam (FIB), a conductive layer (usually copper) is added to the surface of the reticle. This conductive layer discharges the charge caused by the FIB, thereby preventing drifting and improving accuracy. Once the patches have been deposited, the conductive layer is removed by etching (illustratively, in nitric acid). The defect patches tend to lift off the surface of masks because etchant interacts with any residue remaining at the interface of the mask's substrate and the patch and acts as a solvent for the patch. The solvent in this situation tends to leach underneath the patch and lift off the patch.

To overcome these problems, the current invention performs short pulse laser ablation of clear defect regions on a mask prior to patching the clear defect regions. The short pulse laser ablation removes any residue that absorbs light. Thus, the ablation completely cleans the surface of the clear defect regions, meaning that any patches of the surface will better adhere to the surface of the mask. This is particularly important during those situations where a later etch of a conductive surface added to the mask or any later cleaning stage creates a solvent because the etchant interacts with residue on the mask, and wherein the solvent attacks the patch material at the patch material's interface.

The foregoing and other features and advantages of the present invention will be apparent from the following more particular description of preferred embodiments of the invention, as illustrated in the accompanying drawings.

BRIEF DESCRIPTION OF DRAWINGS

Preferred embodiments of the present invention will hereinafter be described in conjunction with the appended drawings, where like designations denote like elements, and.

BEST MODE(S) FOR CARRYING OUT THE INVENTION

As discussed above, needs existed to repair phase shift masks to promote adhesion of clear defect patches and to thereby reduce the propensity for patches on phase shift masks to lift off the mask surface. In preferred embodiments of the present invention, a short pulse laser ablation of clear defect regions is performed any time prior to patching the clear defect regions. The short pulse laser ablation removes any light-absorbing residue on the surface of the mask. Thus, the ablation completely cleans the surface of the clear defect regions, meaning that any patches of the surface will better adhere to the surface of the mask.

The current invention is useful any time a patch over a mask surface has less than ideal adherence to the surface because of residue on the surface. It is particularly useful for situations where a later etchant or other cleaning step interacts with residue on the surface of the mask to produce a solvent that can attack the patch.

Broadly, a method of repairing a mask in accordance with a preferred embodiment of the present invention entails (a) cleaning a region of a defect with a short pulse laser, and (b) applying a patch to the region of the defect.

As a specific example, the attenuated phase shift material could be molysilicide. The molysilicide is etched by patterning a resist and then Reactive Ion Etching (RIE) in an atmosphere containing fluorine. Thus, a monolayer of fluorine is added to the clear regions (and the clear defect regions) of the mask's surface. A copper conductive layer is added prior to Focused Ion Beam (FIB) milling of the clear defects. Some of the fluorine on the surface of the clear defect will still remain, even after Focused Ion Beam (FIB) milling of the clear defects. FIB deposition is performed to add patch material to the defects. When the copper is removed through wet etching with nitric acid, the nitric acid interacts with the residual fluorine to create a solvent that attacks the clear defect patch at the interface of the clear defect patch and the surrounding substrate or at the interface of the clear defect patch and the molysilicide. By using a short pulse laser having a high energy and a very short pulse time (preferably a pulse time in the femtosecond range or smaller), anything that absorbs light will be ablated from the surface of the mask. The short pulse laser ablation may be performed any time prior to adding the patch material to the surface of the mask. Two preferable locations for short pulse laser ablation are discussed in reference to FIGS. 1 and 2.

Figure 1:
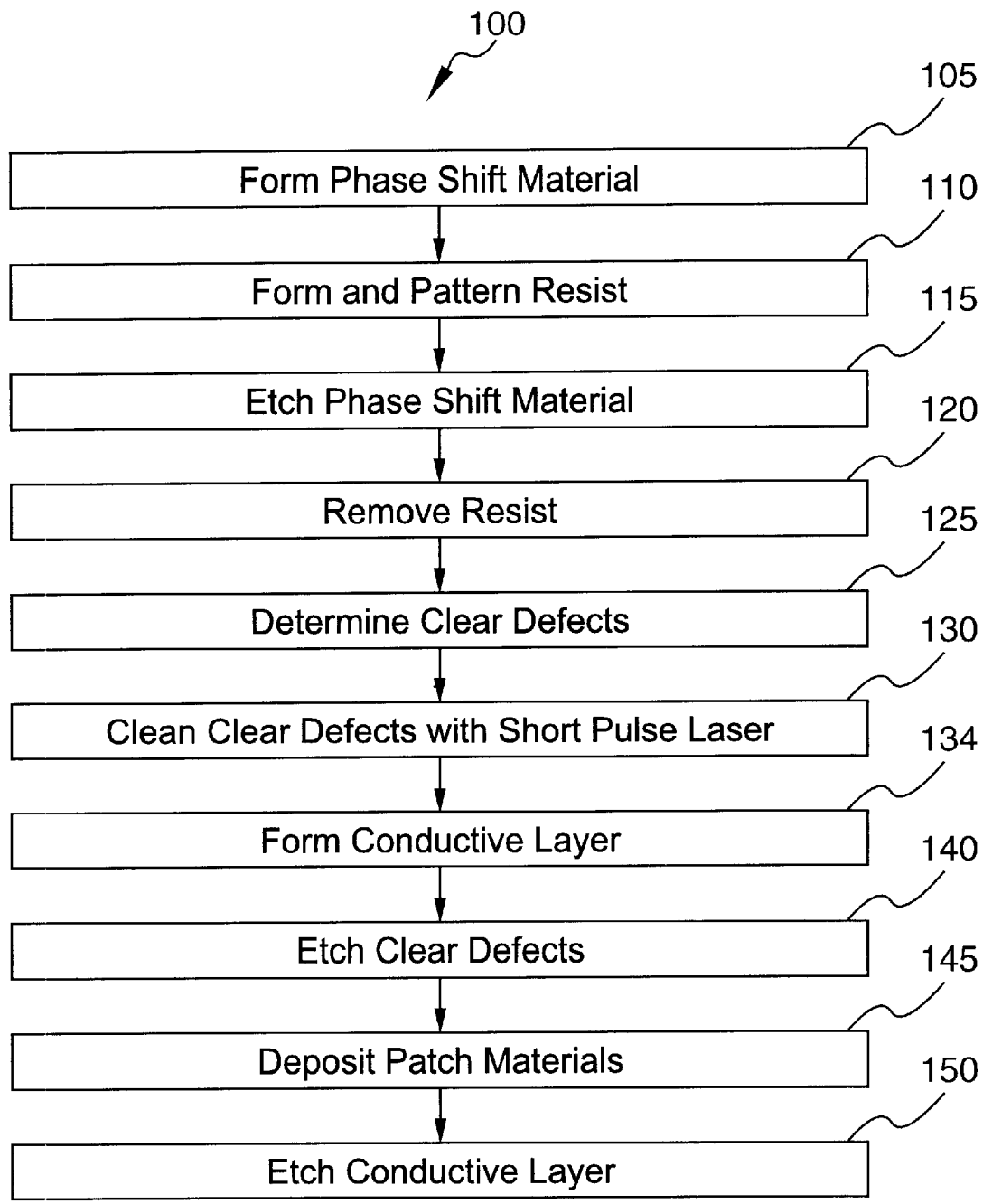
FIGS. 1 and 2 are preferred methods for repairing phase shift masks in accordance with a preferred embodiment of the present invention.

Referring now to FIG. 1, a method 100 is shown for repairing a mask in accordance with a preferred embodiment of the present invention. Method 100 is performed after a mask has been created and the mask patterns have been designed. The mask patterns are used to pattern a photoresist in subsequent steps of method 100. Generally, the mask patterns can be created from a circuit layout, as is well known in the art.

Method 100 begins when a phase shift material is formed, usually through deposition, in step 105. Generally, the phase shift material will be an attenuated phase shift material such as molysilicide or titanium nitride. A photoresist is formed and patterned in step 110. The patterning defines the phase shift material regions: where photoresist is left after develop, phase shift material will be covered and remain after etching; on the contrary, where photoresist is removed after develop, phase shift material will be etched. In step 115, the phase shift material is etched. Illustratively, the etching is a Reactive Ion Etch (RIE) that contains fluorine as one of the parameters of the etch. As is well known in the art, a RIE is both a chemical and a physical etch. The physical aspect of the RIE causes fluorine to be deposited and implanted on top of the clear areas. The fluorine is essentially deposited and implanted in a monolayer.

In step 120, the resist is removed. At this point in the method, the mask should contain defined areas of phase shift material. As is known in the art, at the interface between the phase shift material and clear areas of the mask, light passing through the mask will be cancelled, thereby creating intermediate light energies along these interfaces. These intermediate light energies will cause a sharp step in light intensity and improve resolution of the resist features. Thus, the photoresist layer on the semiconductor will have improved resolution at areas on the photoresist layer that correspond to the interface between the phase shift material and the clear areas of the mask.

In step 125, the clear defects are determined. The step is usually performed by an inspection tool, which can then generate a data file from which the locations and areas of clear defects may be determined. The inspection tool compares the mask's surface, having the patterned phase shift material, with an ideally patterned mask. The clear defect data file may be loaded into a control system for an FIB etch and/or a short pulse laser ablation. A mechanism for performing short pulse laser ablation is discussed in reference to FIG. 3.

In step 130, the clear defects are cleaned with a short pulse laser. A short pulse laser is a laser whose pulse time is in the femtosecond range or smaller than the femtosecond range. For example, a laser with a pulse time of 100 femtoseconds is a short pulse laser, as is a laser with a pulse time of 100 attoseconds. In the embodiment of FIG. 1, the clear defects are cleaned with a short pulse laser prior to adding a conductive layer. By selecting the appropriate energy and appropriate pulse time, a short pulse laser will ablate any residues that absorb light. For example, any molysilicide that is left on the clear defect will be ablated. Because of the short exposure time, the heat generated by the short pulse laser does not significantly heat up the mask. Moreover, the mask should transmit light and should not be affected by the laser's light. If too high of an energy is used, however, the mask may be burnt. If too low of an energy is used, the residues might not be ablated. Thus, the combination of energy and exposure time is important.

If a longer pulse laser is used (such as using picosecond or nanosecond lasers), then the heat from the laser drives the contaminants into the mask, as opposed to ablating the residues. In the latter situation, the contaminants are still on the surface of the mask. Thus, leaching of solvent, caused by a combination of a subsequent etchant and the remaining contaminants, and removal of the patch can still occur.

It should be noted that, if the energy is not high enough to cause burning of the mask's surface, the processes of the current invention should be self-limiting. By this, it is meant that the short pulse laser light should travel through the mask once residues and contaminants have been ablated. Thus, the number of pulses may be increased without harming the mask.

Preferably, the short pulse laser is a femtosecond laser. Such lasers are made by Clark NXR, which is based in Detroit, Michigan, Spectra-Physics, and Coherent. The pulse time of the laser is preferably 100 femtoseconds (fs), where the pulse time is determined as the time one pulse of the laser strikes the surface of the mask. One particular laser suitable for use with the current invention has a pulse frequency (in pulses per second) of 1000 hertz (Hz) and a wavelength of 387 and ½ nanometers. Preferably, a physical shutter opens for 30 milliseconds to allow 30 pulses to reach the mask's surface. Each pulse removes some residue or contamination. A pulse "train" of 30 pulses can remove approximately 30 times the amount of contamination than a single pulse can. The amount of contamination removal for each pulse depends on the energy in each pulse. Using an energy of 5 microjoules per pulse at 100 fs of time would deliver a high amount of power per pulse to the mask's surface.

By using a mechanical shutter in the laser's path that opens and closes, an appropriate total pulse time or number of pulses may be delivered to the surface of the mask. As previously discussed, preferably 30 pulses at 100 fs each are directed to one region of the defect, then the laser is moved (or, more likely, the mask is moved) to another location for another 30 pulses. If residual residue or contamination is, however, still observed at this location, more pulses may be directed to this location. As the contamination is removed, the laser light will then go through the glass. The process is self-limiting in the sense that the light will travel through the mask once the contamination is ablated, and the proper selection of laser energy will prevent harm to the mask even after the contamination is ablated. The number of pulses and pulse time for each pulse may be adjusted to best remove the contamination, and the energy may be adjusted to prevent damaging the mask.

It is possible, however, to use an energy that is too high and that will physically burn the mask's surface. Preferably, the laser will deliver 1–20 microjoules per pulse, and typically will deliver 5 microjoules to the mask's surface per pulse. It should be noted that the quoted energy is measured at the mask's surface. The energy may be measured in any way known to those skilled in the art. For instance, the energy could be measured upstream of the mask's surface. In this manner, any energy lost through subsequent filters (which take out a known amount of energy and are between the measuring location and the mask surface) can be compensated for in the energy measurement. As previously discussed, too high of an energy will burn the mask's surface. Additionally, too low of an energy could leave residual contamination.

It should be noted that the laser will generally travel through an aperture before reaching the mask's surface. The shape of the aperture will dictate the shape of the laser pulse that strikes the mask's surface. Apertures suitable for use with the current invention are as wide as about 6 micrometers (microns) square. Commonly, a 0.5 micron by 2 micron rectangle is used, as many clear defects are about 1 micron square. It should also be noted that any phase shift material, such as molybdenum silicide or molysilicide, that is within the laser's path when the laser strikes the surface fo the mask will be ablated. However, this should not be a problem, as the aperture should create defined areas of cleaned mask surfaces.

It should also be noted that apertures are not necessary to practice the current invention. Additionally, a focusing mechanism may be used to focus the laser pulse to small sizes, such as a 2 micron circular size at the surface of the mask. Apertures are, however, beneficial to shape the laser pulse, if shaping is desired. Moreover, a combination of apertures and focusing mechanisms may be used, if desired, as is known in the art.

Once all of the clear defects have been cleaned, a conductive layer is formed on the surface of the mask in step 135. This conductive layer is usually deposited copper, and is used to prevent the FIB's wandering during milling and deposition. This layer may be grounded, but grounding is not necessary. In step 140, an etch of clear defects is performed, and the etch in this example is an FIB etch. The FIB etch clears away the conductive layer on the clear defects and further mills the surface of the mask at the clear defects. In prior art methods, the FIB etch of the clear defects was used both to clean the surface of the mask and to remove the conductive layer. In the embodiments of the present invention, the FIB etch of the clear defects is performed mainly to remove the conductive layer, as the surface of the mask should be very clean from the short pulse laser ablation. After the FIB etch of clear defects, there is a deposition of patch material. This occurs in step 145. To deposit patch material, the process parameters of the FIB etch are changed to a deposition mode. By changing the process parameters, different types of patch material may be added. Illustratively, the patch material could be a gold-carbon mixture approximately 1000 angstroms thick, this thickness based on transmission requirements, meaning that the gold-carbon mixture will not transmit light.

Generally, one clear defect region is milled and then patched before proceeding to the next clear defect region. Because of this, steps 140 and 145 will usually be performed multiple times.

After the patch material has been deposited to each of the clear defects, in step 150 the conductive layer is etched. Illustratively, the etchant used to remove copper is nitric acid. In the prior art methods, the combination of nitric acid and residual fluorine left from the etch of the phase shift material creates a solvent that can leach under the patch and/or attack the patch, both of which cause the patch to lift off of the mask. In the current method, any contaminants have been ablated by the short pulse laser and are no longer there to interact with the etchant. In the particular example of a nitric acid etchant used to etch copper and a fluorinated etch used to etch the phase shift material, the monolayer of fluorine that covers the clear defects and that is caused by the latter etch has been completely evaporated by the short pulse laser. Thus, the gold-carbon mixture patch is much more likely to stay on the surface of the mask.

The current invention is applicable to any mask wherein cleaning is necessary to prevent a patch from lifting from the surface of the mask because of residues left on the surface. In particular, fluorinated wet or dry etches used to remove phase shift material will leave fluorine residues that will react with a nitric acid etch used to remove a copper surface, and will create a solvent that can leach under and remove clear defect patches.

Figure 2:
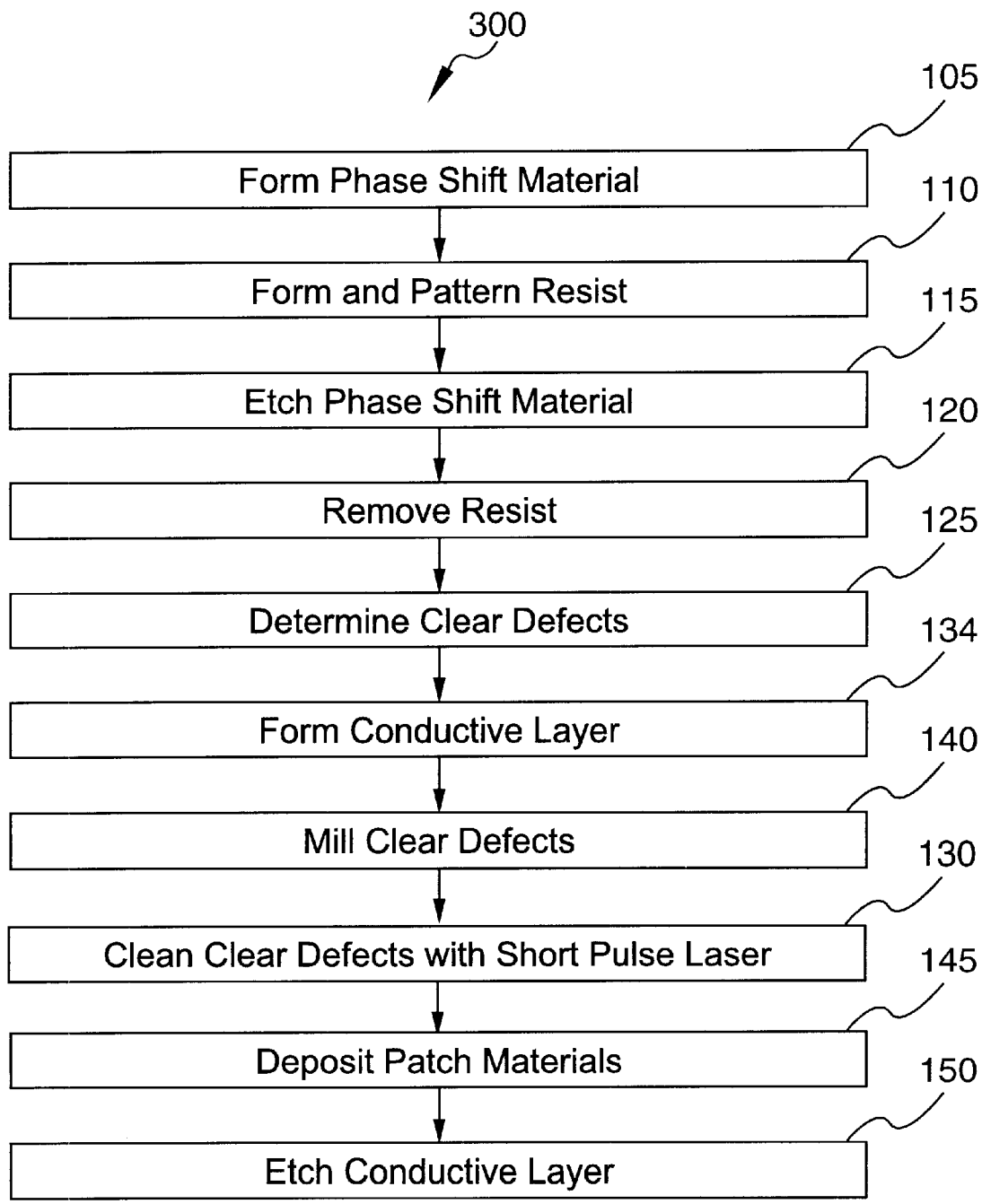

Turning now to FIG. 2, another preferred method for repairing a mask is shown. In this method, the steps of FIG. 1 are shown in a different order. It should be noted that cleaning of the mask with a short pulse laser may occur any time prior to the application of patch material to the defects, and that FIGS. 1 and 2 simply illustrate the most preferred embodiments of the current invention for these particular process steps.

In FIG. 2, the phase shift material is formed on the mask (step 105), the resist is formed and patterned (step 110), the phase shift material is etched (step 120), the resist is removed (step 120), the clear defects are determined (step 125), the conductive layer is deposited (step 134), and an etch of one of the clear defects is performed (step 140). After these steps, then the clear defects are cleaned by using a short pulse laser (step 130), as described above in reference to FIG. 1. Next, the patch material is deposited onto the clear defect (step 145). This is preferably done by changing the parameters of the FIB so that the FIB deposits the patch material onto the clear defect. In this embodiment, steps 140, 130, and 145 will usually be performed in this order for each of the clear defects, until all defects have been repaired. A less preferred method is to perform the first step (step 140) until all clear defects have been affected by this step, then perform the next step (step 130) until all clear defects have been affected by this step, etc.

When all clear defects have been patched, the conductive layer is etched in step 150. Because the clear defects have been cleaned using the methods of the current invention, there should be no residues on the surface of the mask and on the clear defects that can interact with the etchant to cause the patch to come off the surface of the mask. In particular, for a nitric acid etch of a copper conductive layer, any fluorine from a previous etch will interact with the nitric acid to attack patch at the patch's interface with the surrounding mask substrate.

Figure 3:
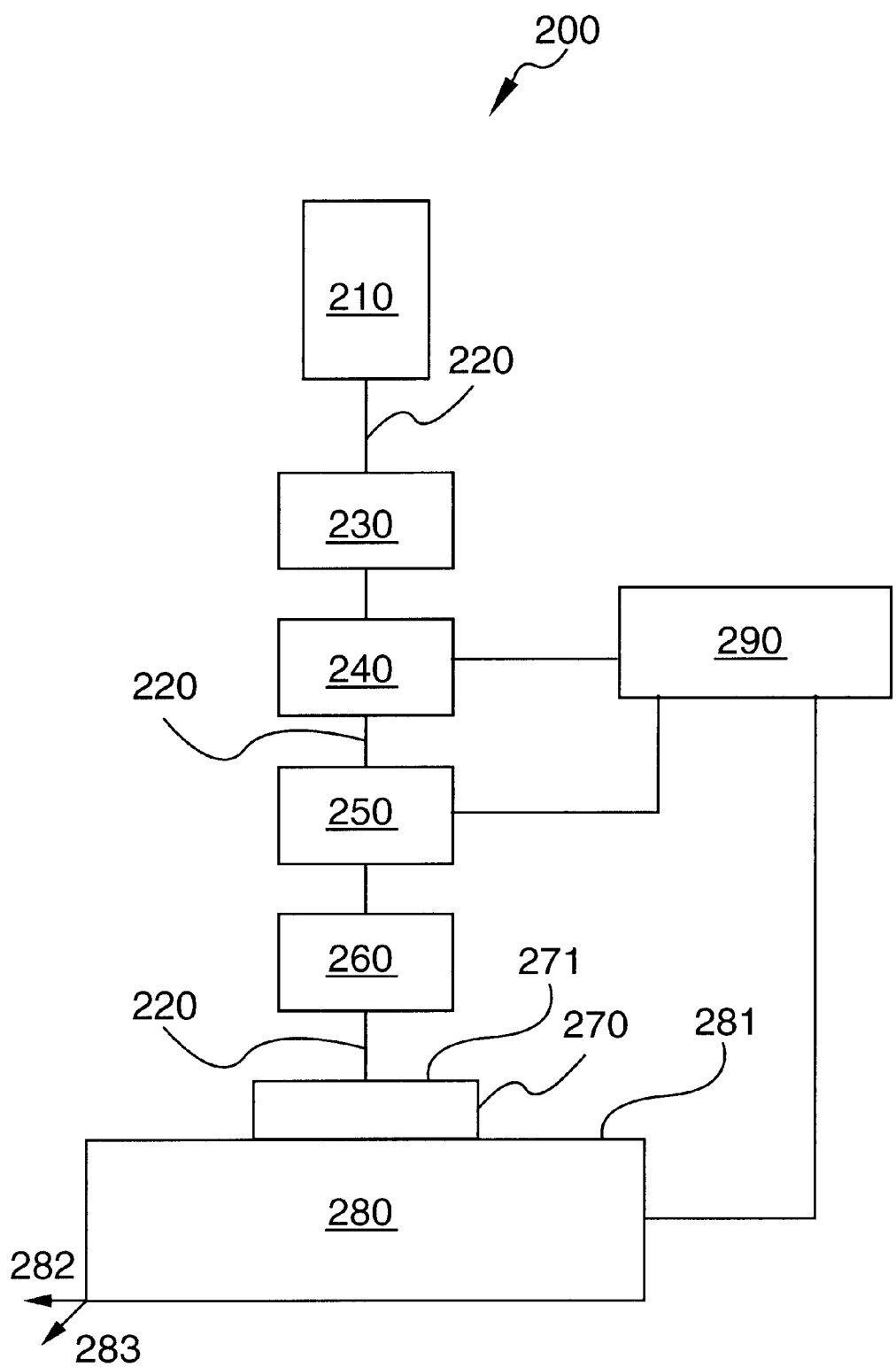
FIG. 3 is a mask repair system for use with the preferred embodiments of the present invention.

Referring now to FIG. 3, FIG. 3 shows a block diagram of a mask repair system for use with the preferred embodiments of the present invention. Mask repair system 200 comprises a short pulse laser 220 that emits a laser beam 220, optics 230 to direct the laser beam, filter 240, shutter 250, objective 260, high precision table 280, and control system 290. Not shown, though preferred, is an aperture, which may be part of shutter 250, objective 260, or optics 230. The aperture causes specific light patterns for laser beam 220. Preferred patterns are square or rectangular. Mask 270 is placed on high precision table 280, which also has a portion of the table that is an air table. Mask 270 is held to the surface 281 of the of the high precision table, usually by a mechanical fixture. High precision table 280 is an x,y table that can move in directions 282 and 281. As is known in the art, high precision table 280 can move with great precision. Generally, the table must be aligned manually, at least initially. However, the high precision table 280 is computer controlled (the computer is not shown in FIG. 3) and the computer takes defect data that is generated by an inspection tool and "drives" the mask to each subsequent defect.

Control system 290 controls the shutter 250, filters 240, and laser 210. Control system 290 may also control or interact with the high precision table 280. Generally, the control system 290 will turn on the laser 210 and adjust the filters 240 to achieve the proper laser energy at the mask surface 271. Additionally, the control system 290 can control the shutter to provide the optimal number of pulses and pulse times of these pulses. As described above, the shutter preferably lets laser light pass such that 30 pulses of light, with each pulse of light being 100 fs long, will reach the surface of the wafer. Control system 290 can control the time that the shutter 250 is open to increase or decrease the number of pulses. As described above, the energy of the laser and the pulse time affect how long the shutter should be open.

Not shown in FIG. 3 is a feedback system that determines the laser beam's 220 energy at the surface 271 of the mask. This feedback system, as described above, could determine the energy at the surface 217 of the mask or upstream of the surface (such as upstream of filters 240, with corrections for the energy lost through filters 240 and other intervening stages).

What has been shown is a short pulse laser ablation of clear defect regions on a mask prior to patching the clear defect regions. The short pulse laser ablation removes any residue that absorbs light. Thus, the ablation completely cleans the surface of the clear defect regions, meaning that any patches of the surface will better adhere to the surface of the mask. This is particularly important during those situations where a later etch of a conductive surface added to the mask creates a solvent because the etchant interacts with residue on the mask, and wherein the solvent attacks the patch material at the patch material's interface.

While the invention has been particularly shown and described with reference to preferred embodiments thereof, it will be understood by those skilled in the art that various changes in form and details may be made therein without departing from the spirit and scope of the invention. Accordingly, unless otherwise specified, any dimensions of the apparatus indicated in the drawings or herein are given as an example of possible dimensions and not as a limitation. Similarly, unless otherwise specified, any sequence of steps of the method indicated in the drawings or herein are given as an example of a possible sequence and not as a limitation.

What is claimed is:

1. A method for repairing a mask comprising the steps of:
    determining at least one clear defect;
    cleaning a region of the clear defect by using a short pulse laser; and
    after cleaning the region of the clear defect, applying a patch to the region of the defect;
    wherein said cleaning step prevents the patch from lifting away from surrounding mask substrate.

2. The method of claim 1 wherein the step of cleaning a region of a defect by using a short pulse laser further comprises the step of directing light emitted from the short pulse laser onto a surface of the region.

3. The method of claim 2 wherein the short pulse laser produces a plurality of pulses, each pulse having a pulse time, and wherein the step of directing light emitted from the short pulse laser onto a surface of the region further comprises the step of preventing light emitted from the laser from reaching the surface of the region after a predetermined number of pulses have reached the surface of the region.

4. The method of claim 3 wherein the short pulse laser is a femtosecond laser having a pulse time of 100 femtoseconds.

5. The method of claim 3 wherein the step of directing light emitted from the short pulse laser onto a surface of the region further comprises the step of adjusting energy of the short pulse laser wherein the light incident to the surface of the region has an energy of 1 to 20 microjoules.

6. The method of claim 5 wherein the step of adjusting energy of the short pulse laser wherein the light incident to the surface of the region has an energy of 1 to 20 microjoules further comprises the step of adjusting energy of the short pulse laser wherein the light incident to the surface of the region has an energy of 5 microjoules.

7. The method of claim 1 wherein the step of applying a patch to the region of the defect further comprises the step of performing a focused ion beam deposition of at least one patch material onto the region of the defect.

8. The method of claim 1 wherein the method further comprises the steps of:
    forming and patterning a layer of phase shift material on a surface of the mask, the step of forming and patterning leaving at least one contaminant on the surface of the mask;
    forming a conductive layer with an etchant, the etchant and the at least one contaminant forming a solvent that interacts with the patch at interfaces between patch material and surrounding mask substrate; and
    wherein the step of cleaning a region of a defect removes the at least one contaminant on the surface of the defect so as to prevent the solvent from forming.

9. The method of claim 1 wherein the step of applying a patch to the region of the defect further comprises the step of performing a focused ion beam deposition of at least one patch material onto the region of the defect, and wherein the method further comprises the steps of:
    forming and patterning a layer of phase shift material on a surface of the mask;
    forming a conductive layer over the surface of the mask;
    etching the at least one clear defect with a focused ion beam; and
    etching the conductive layer.

10. The method of claim 9 wherein the step of forming and patterning a layer of phase shift material on a surface of the mask comprises the step of performing a reactive ion etch of the mask in an atmosphere comprising fluorine, and wherein the step of etching the conductive layer comprises the step of performing a nitric acid etch of the mask.

11. The method of claim 10 wherein the conductive layer comprises copper.

12. The method of claim 10 wherein the phase shift material comprises molysilicide.

13. A method for repairing a phase shift mask comprising the steps of:
    forming and patterning a layer of phase shift material on a surface of the mask;
    determining at least one clear defect, which is an area where the phase shift material should be but where there is no phase shift material;
    cleaning a region of the at least one clear defect by using a short pulse laser that can produce a plurality of pulses, each pulse having a pulse time less than or equal to 100 femtoseconds;
    forming a conductive layer over the surface of the mask;
    etching the at least one clear defect to remove the conductive layer covering the at least one clear defect;

applying a patch to the region of the at least one clear defect; and etching the remaining conductive layer to remove the conductive layer from the surface of the mask.

14. The method of claim 13 wherein the step of cleaning a region of the at least one clear defect occurs before the step of applying a patch to the region of the at least one clear defect.

15. The method of claim 14 wherein the step of cleaning a region of the at least one clear defect occurs before the step of forming a conductive layer over the surface of the mask.

16. The method of claim 14 wherein the step of cleaning a region of the at least one clear defect occurs after the step of etching the at least one clear defect.

17. The method of claim 13 wherein the step of cleaning a region of the at least one clear defect further comprises the steps of:

directing light emitted from the short pulse laser onto a surface of the region; and adjusting energy of the short pulse laser wherein the light incident to the surface of the region has an energy of 1 to 20 microjoules.

18. The method of claim 17 wherein the step of adjusting energy of the short pulse laser wherein the light incident to the surface of the region has an energy of 1 to 20 microjoules further comprises the step of adjusting energy of the short pulse laser wherein the light incident to the surface of the region has an energy of 5 microjoules.

19. The method of claim 13 wherein the step of applying a patch to the region of the at least one clear defect further comprises the step of performing a focused ion beam deposition of at least one patch material onto the region of the defect.

20. The method of claim 13 wherein the step of forming and patterning a layer of phase shift material on a surface of the mask comprises the step of performing a reactive ion etch of the mask in an atmosphere comprising fluorine, and wherein the step of etching the remaining conductive layer comprises the step of performing a nitric acid etch of the mask.

21. The method of claim 13 wherein the conductive layer comprises copper.

22. The method of claim 13 wherein the phase shift material comprises molysilicide.

23. The method of claim 1 wherein the surrounding mask substrate is phase shift material.

* * * * *